(12) United States Patent
Xu et al.

(10) Patent No.: US 9,035,676 B2
(45) Date of Patent: May 19, 2015

(54) LEVEL SHIFTER WITH LOW VOLTAGE LOSS

(71) Applicant: Parade Technologies, Ltd., Santa Clara, CA (US)

(72) Inventors: Liang Xu, Shanghai (CN); Hongquan Wang, Shanghai (CN)

(73) Assignee: Parade Technologies, Ltd., Grand Cayman (KY)

( * ) Notice: Subject to any disclaimer, the term of this patent is extended or adjusted under 35 U.S.C. 154(b) by 173 days.

(21) Appl. No.: 13/689,534

(22) Filed: Nov. 29, 2012

(65) Prior Publication Data

US 2013/0155046 A1  Jun. 20, 2013

(30) Foreign Application Priority Data

Dec. 20, 2011 (CN) .......................... 2011 1 0456746

(51) Int. Cl.
| | | |
|---|---|---|
| *H03K 19/017* | (2006.01) | |
| *H03K 19/094* | (2006.01) | |
| *H04N 5/66* | (2006.01) | |
| *G09G 5/00* | (2006.01) | |
| *H03K 19/0185* | (2006.01) | |

(52) U.S. Cl.
CPC ................. *H04N 5/66* (2013.01); *G09G 5/006* (2013.01); *H03K 19/018507* (2013.01)

(58) Field of Classification Search
USPC ............. 326/63, 68, 80, 82, 86; 327/333, 437
See application file for complete search history.

(56) References Cited

U.S. PATENT DOCUMENTS

| 7,372,301 B2* | 5/2008 | Fukuoka et al. ................. 326/81 |
| 7,808,274 B2* | 10/2010 | Dover et al. .................... 326/63 |
| 2010/0194994 A1* | 8/2010 | Lee et al. ...................... 348/723 |
| 2013/0002299 A1* | 1/2013 | Hung et al. ..................... 326/68 |

* cited by examiner

*Primary Examiner* — Daniel D Chang
(74) *Attorney, Agent, or Firm* — Fenwick & West LLP

(57) ABSTRACT

A system and method are disclosed for level shifting a DDC bus with a low voltage loss. A pull up circuit includes an NMOS transistor, a PMOS transistor and resistor. An NMOS pull up gate is also included in line with the DDC bus. When powered, the level shifter adjusts the voltage of transmitted signals to match the voltage of a receiving device. The resulting adjusted is slightly lower due to a threshold voltage lost across one or more transistors. Additionally, when unpowered, the level shifter releases the signal transmission line. Unadjusted signals can then be transmitted without consumption of power by the level shifter.

20 Claims, 3 Drawing Sheets

LEVEL SHIFTER WITH LOW VOLTAGE LOSS

CROSS-REFERENCE TO RELATED APPLICATIONS

This application claims priority under 35 U.S.C. §119 to Chinese patent application 201110456746.X, filed Dec. 20, 2011, the contents of which are incorporated by reference.

BACKGROUND

1. Field of Art

The disclosure generally relates to a level shifter with a low voltage loss between a source and sink. More specifically, the disclosure relates to a level shifter with voltage loss between two video interfaces operating at different voltages.

2. Description of the Related Art

In converting from one interface standard to another, the voltage level of signals being transmitted may need to be adjusted. For example, DISPLAYPORT (DP) is capable of emitting single link High-Definition Multimedia Interface (HDMI) signals in dual-mode DP. DP operates at 3.3 volts, while HDMI operates at 5 volts. For compatibility, a level shifter is included between a DP source and an HDMI sink. Conventionally, a 3.3V n-channel metal-oxide-semiconductor field-effect transistor (NMOS) pass gate is used to block 5V signals from the HDMI sink. However, with the gate tied to 3.3V, the maximum voltage output is 3.3V less a threshold voltage. With the threshold voltage possibly reaching near 1 V or higher, the maximum voltage output of the signal after level shifting is significantly reduced. This can produce costly logic errors during reception. In addition, certain configurations do not release the display data channel when power is not provided to the level shifter. This can increase power consumption in situations where level shifting is unnecessary, but a signal must still be transmitted.

BRIEF DESCRIPTION OF DRAWINGS

The disclosed embodiments have other advantages and features which will be more readily apparent from the detailed description, the appended claims, and the accompanying figures (or drawings). A brief introduction of the figures is below.

Figure (FIG.) 1 illustrates a source and a sink with an intermediate level shifter.

DETAILED DESCRIPTION

The Figures (FIGS.) and the following description relate to preferred embodiments by way of illustration only. It should be noted that from the following discussion, alternative embodiments of the structures and methods disclosed herein will be readily recognized as viable alternatives that may be employed without departing from the principles of what is claimed.

Reference will now be made in detail to several embodiments, examples of which are illustrated in the accompanying figures. It is noted that wherever practicable similar or like reference numbers may be used in the figures and may indicate similar or like functionality. The figures depict embodiments of the disclosed system (or method) for purposes of illustration only. One skilled in the art will readily recognize from the following description that alternative embodiments of the structures and methods illustrated herein may be employed without departing from the principles described herein.

Configuration Overview

A system and method for level shifting with low voltage loss are described herein. Converting from a first video interface standard to a second video interface standard may require adjusting the voltage level of transmitted signals. For example, in an example embodiment, a DISPLAYPORT interface operating at 3.3 volts is communicatively coupled with an HDMI interface operating at 5 volts. A level shifter may be placed between the DISPLAYPORT and HDMI interfaces. The level shifter receives a first signal from the HDMI interface at 5 volts. The level shifter reduces the voltage level of the first signal to match the voltage level of the DISPLAYPORT interface. The level shifter subsequently transmits the first signal with a reduced voltage level to the DISPLAYPORT interface. Similarly, the level shifter may receive a second signal from the DISPLAYPORT interface at 3.3 volts. The level shifter then increases the voltage level of the second signal to match the voltage level of the HDMI interface. The second signal with an increased voltage level is then transmitted to the HDMI interface.

System Overview

Referring now to Figure (FIG.) 1, illustrated is a source 102 and a sink 106 with an intermediate level shifter 104. The source 102 is communicatively coupled to the level shifter 104. The level shifter 104 is communicatively coupled to the sink 106. In one embodiment, source 102 and sink 106 are video display interfaces operating at different voltage levels. Transmissions from the source 102 to the sink 106 are adjusted by the level shifter 104 to apply compatible voltage levels and perform any other processing for compatibility. In one embodiment, sink 106 is also capable of transmitting signals to the source 102, the signal being similarly modified for compatibility by the level shifter 104.

Figure 1:
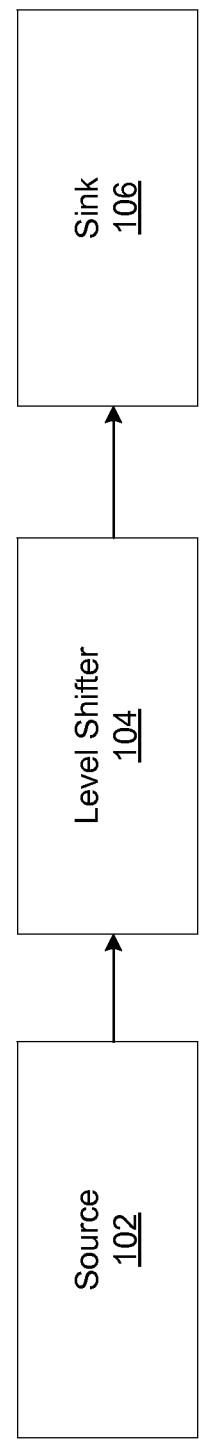
Figure 2:
FIG. 2 illustrates a DP interface and an HDMI interface with an intermediate level shifter in accordance with one embodiment.

FIG. 2 illustrates a dual mode DP interface 202 and an HDMI interface 206 with an intermediate level shifter 204 in accordance with one embodiment. A dual mode DP interface is capable of operating in dual-mode which outputs single link HDMI (or digital visual interface (DVI)) signals. However, the DP interface standard operates at 3.3V, while the HDMI interface standard operates at 5V. The DP interface may be damaged if 5V signals are allowed to reach the DP interface. Additionally, 3.3V signals transmitted to the HDMI interface may be misinterpreted resulted in logic errors. The DP interface 202 is communicatively coupled to the level shifter 204 and the level shifter 204 is communicatively coupled to the HDMI interface 206. The outputted single link HDMI signals are then first sent to the level shifter 204 to alter the voltage level of the single link HDMI signal. Similarly, the voltage levels of signals originating from the HDMI interface 206 are modified before reaching the DP interface 202. In one embodiment, the level shifter 204 performs additional modifications to signals beyond altering their voltage level that are conducive to compatibility.

Example Level Shifter

Figure 3:
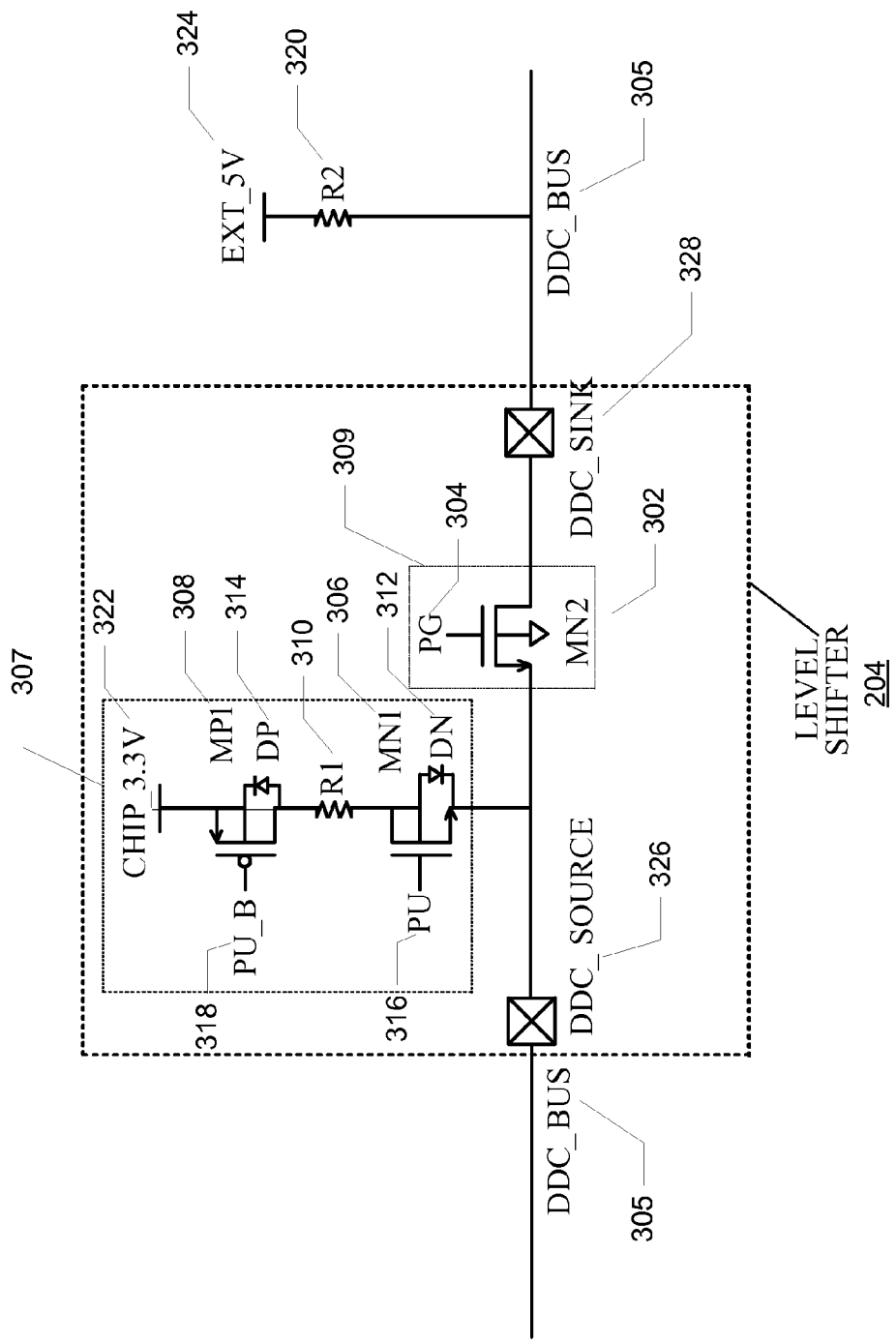
FIG. 3 illustrates a detailed view of the level shifter between the DP interface and HDMI interface of FIG. 2 in accordance with one embodiment.

FIG. 3 illustrates an example embodiment of the level shifter 204 between the DP interface 202 and HDMI interface 206 of FIG. 2 in accordance with one embodiment. FIG. 3 includes a display data channel (DDC) bus communicatively coupling a DDC_SOURCE 326 and a DDC_SINK 328. The DDC_BUS 305 allows transmission of video display data to a display device and allows a source to adjust monitor parameters. The DDC_BUS 305 path between DDC_SOURCE 326 and DDC_SINK 328 includes a pull up circuit 307 and pass gate 309. The level shifter circuit illustrated in level shifter 204 includes a 3.3V thick oxide NMOS pass gate MN2 302 controlled by signal PG 304. NMOS MN1 306, PMOS MP1 308 and resistor R 310 make up portions of a pull-up circuit. The pull-up (PU) path connects a 3.3V voltage source and a point between the DDC_SOURCE 326 from the DP interface and MN2 302. DN 312 is the parasitic diode of MN1 306 and DP 314 is the parasitic diode of MP1 308. MN1 306 is controlled by signal PU 316 and MP1 308 is controlled by signal PU_B 318, which is the inverse signal of PU 316. A pull-up resistor circuit including resistor R2 320 is between the DDC_SINK 328 and a 5V voltage source.

In operation, the level shifter, the 3.3V voltage source 322 and 5V voltage source 324 are powered on. Control signals PG 304 and PU 316 are set high and PU_B is correspondingly low. The drain of MP1 308 voltage is equal to the 3.3V voltage source 322, or VDD. As a forward biased substrate, the threshold voltage of MN1 306 decreases 200 mV. This is significantly less than might be observed in a typical level shifting circuit. When transmitting a logic '1' from DDC_SOURCE to DDC_SINK, the pull-up resistor circuit which includes resistor R2 320 pulls the voltage up to 5V in accordance with the 5V operation of the HDMI device. When transmitting a logical '1' from DDC_SINK to DDC_SOURCE, the signal is close to 3.3V, though less due to the voltage threshold loss of MN2 302. When transmitting a logical '0', pull-up current from the 3.3V voltage source 322 or the 5V voltage source 324 will not prevent the DDC bus being pulled down to 0.

If power is provided to the level shifter, the 3.3V voltage source 322 and the 5V voltage source 324, the DDC path can be kept closed. For example, if signals PG 304 and PU 316 are kept low, and PU_B 318 is correspondingly high, both the DDC path between DDC_SOURCE and DDC_SINK as well as the pull-up path to the 3.3V voltage source 322 are closed.

Additionally, when the level shifter is not provided power, the DDC is released. In this situation, the 3.3V voltage source 322, PG 304, PU 316, and PU_B 318 are all low. Since the MN1 substrate is connected to the drain, current between the DDC bus and the 3.3V voltage source will not flow. Therefore, the pull down path is blocked and the DDC bus is able to freely transmit without the level shifting provided by the powered circuit.

The disclosed system and method provide several advantages in implementation. First, voltage level is shifted appropriately to a level near the operational voltage level of the receiving video interface. Minimal voltage is lost across the pull-up circuit from the 3.3V voltage source 322. In addition, in some situations, allowing transmission of signals on the DDC_BUS 305 without voltage level modification may be desirable. The disclosed configuration allows for the DDC BUS 305 to be released when the level shifter is unpowered. Therefore, transmission of signals on the DDC_BUS 305 without voltage level modification is possible without power consumption that may be required in other implemented configurations.

Unless specifically stated otherwise, discussions herein using words such as "processing," "computing," "calculating," "determining," "presenting," "displaying," or the like may refer to actions or processes of a machine (e.g., a computer) that manipulates or transforms data represented as physical (e.g., electronic, magnetic, or optical) quantities within one or more memories (e.g., volatile memory, non-volatile memory, or a combination thereof), registers, or other machine components that receive, store, transmit, or display information.

As used herein any reference to "one embodiment" or "an embodiment" means that a particular element, feature, structure, or characteristic described in connection with the embodiment is included in at least one embodiment. The phrase "in one embodiment" in various places in the specification is not necessarily all referring to the same embodiment.

Some embodiments may be described using the expression "coupled" and "connected" along with their derivatives. For example, some embodiments may be described using the term "coupled" to indicate that two or more elements are in direct physical or electrical contact. The term "coupled," however, may also mean that two or more elements are not in direct contact with each other, but yet still co-operate or interact with each other. The embodiments are not limited in this context.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

In addition, use of the "a" or "an" are employed to describe elements and components of the embodiments herein. This is done merely for convenience and to give a general sense of the invention. This description should be read to include one or at least one and the singular also includes the plural unless it is obvious that it is meant otherwise.

Upon reading this disclosure, those of skill in the art will appreciate still additional alternative structural and functional designs for a DDC level shifter with low voltage loss through the disclosed principles herein. Thus, while particular embodiments and applications have been illustrated and described, it is to be understood that the disclosed embodiments are not limited to the precise construction and components disclosed herein. Various modifications, changes and variations, which will be apparent to those skilled in the art, may be made in the arrangement, operation and details of the method and apparatus disclosed herein without departing from the spirit and scope defined in the appended claims.

What is claimed is:

1. A method for voltage level shifting display data transmitted along a display data channel between a first video interface and a second video interface, the method comprising:

receiving at a voltage level shifter circuit a first signal from a first video interface operating at a first voltage level, the first signal having a voltage corresponding to the first voltage level;

enabling a pull-up circuit to cause current to flow from a level shifter reference voltage source included in the level shifter circuit to the display data channel, responsive to receiving at least one pull-up circuit control signal having a first state;

adjusting, using the voltage level shifter circuit, a voltage of the first signal to match a voltage of a second video interface, coupled to receive the first signal from the level shifter circuit using the display data channel, the second video interface operating at a second voltage level, the second voltage level having a value between zero and a value of the first voltage level;

transmitting, the first signal with an adjusted voltage level to the second video interface using the display data channel; and disabling the pull-up circuit to block current from flowing from the display data channel to the level shifter reference voltage source when the level shifter circuit is powered off, responsive to receiving the at least one pull-up circuit control signal having a second state.

2. The method of claim 1, further comprising:

receiving a second signal from the second video interface, the second signal having a voltage level matching the second voltage level of the second video interface;

increasing the voltage level of the second signal to match the voltage level of the first video interface; and transmitting the second signal with an increased voltage level to the first video interface.

3. The method of claim 2, further comprising:

receiving a third signal from the first video interface, the received third signal having a voltage level of zero; and transmitting the third signal to the second video interface.

4. The method of claim 3, further comprising:

receiving a fourth signal from the second video interface, the received fourth signal having a voltage level of zero; and transmitting the fourth signal to the first video interface.

5. The method of claim 1, wherein the first video interface is High-Definition Multimedia Interface (HDMI) or Digital Visual Interface (DVI).

6. The method of claim 5, wherein the second video interface is DISPLAYPORT.

7. The method of claim 1, wherein the first state of the at least one pull-up circuit control signal is a logic 1.

8. The method of claim 1, wherein the second state of the at least one pull-up circuit control signal is a logic 0.

9. An apparatus for level shifting with low voltage loss, the apparatus comprising:

a display data channel coupled to a source operating at a first voltage level and a sink operating at a second voltage level;

an NMOS pass gate in line with the display data channel and coupled to the sink; and a pull up circuit coupled to the display data channel between the source and the NMOS pass gate, the pull up circuit comprising an NMOS transistor, a PMOS transistor and a first resistor between the NMOS transistor and PMOS transistor, wherein the PMOS transistor is coupled to a first voltage source at the first voltage level.

10. The apparatus of claim 9, further comprising:

a pull-up resistor circuit coupled to the sink, the pull-up resistor circuit comprising a second resistor coupled to a second voltage source at the second voltage level.

11. The apparatus of claim 10, wherein the source is a DISPLAYPORT video interface.

12. The apparatus of claim 10, wherein the sink is an HDMI or DVI video interface.

13. The apparatus of claim 10, wherein the first voltage source is unpowered and the display data channel is capable of transmitting a logic 1 or 0.

14. The apparatus of claim 10, wherein the NMOS transistor and the PMOS transistor include parasitic diodes.

15. An apparatus for voltage level shifting display data transmitted along a display data channel between a first video interface and a second video interface, the apparatus comprising:

a means for receiving a first signal from the first video interface, the first video interface operating at a first voltage level, the first signal having a voltage corresponding to the first voltage level;

a means for enabling current to flow from a level shifter reference voltage source to the display data channel, responsive to receiving at least one control signal having a first state;

a means for adjusting a voltage of the first signal to match a voltage of the second video interface, the second video interface operating at a second voltage level, the second voltage level having a value between zero and a value of the first voltage level;

a voltage level shifting means for transmitting the first signal with an adjusted voltage level to the second video interface using the display data channel; and a means for blocking current from flowing from the display data channel to the level shifter reference voltage source when the level shifting means is powered off, responsive to receiving the at least one control signal having a second state.

16. The apparatus of claim 15, further comprising:

a means for receiving a second signal from the second video interface, the second signal having a voltage level matching the second voltage level of the second video interface;

a means for increasing the voltage level of the second signal to match voltage level of the first video interface; and a means for transmitting the second signal with an increased voltage level to the first video interface.

17. The apparatus of claim 16, further comprising:

a means for receiving a third signal from the first video interface, the received third signal having a voltage level of zero; and a means for transmitting the third signal to the second video interface.

18. The apparatus of claim 17, further comprising:

a means for receiving a fourth signal from the second video interface, the received fourth signal having a voltage level of zero; and a means for transmitting the fourth signal to the first video interface.

19. The apparatus of claim 15, wherein the first state of the at least one control signal is a logic 1.

20. The apparatus of claim 15, wherein the second state of the at least one control signal is a logic 0.

* * * * *

UNITED STATES PATENT AND TRADEMARK OFFICE
CERTIFICATE OF CORRECTION

PATENT NO. : 9,035,676 B2  
APPLICATION NO. : 13/689534  
DATED : May 19, 2015  
INVENTOR(S) : Liang Xu and Hongquan Wang Page 1 of 1

It is certified that error appears in the above-identified patent and that said Letters Patent is hereby corrected as shown below:

Title page 1, column 2, Item (57), line 6 of the Abstract, delete "The resulting adjusted is slightly" and insert --The resulting adjusted voltage is slightly--.

Signed and Sealed this  
Third Day of May, 2016

Michelle K. Lee  
*Director of the United States Patent and Trademark Office*